United States Patent [19]
Jiang et al.

[11] Patent Number: 6,084,311
[45] Date of Patent: Jul. 4, 2000

[54] METHOD AND APPARATUS FOR REDUCING RESIN BLEED DURING THE FORMATION OF A SEMICONDUCTOR DEVICE

[75] Inventors: Tongbi Jiang; Ed A. Schrock, both of Boise; John E. Vannortwick, Kuna, all of Id.

[73] Assignee: Micron Technology, Inc., Boise, Id.

[21] Appl. No.: 08/862,093

[22] Filed: May 22, 1997

[51] Int. Cl.[7] ............................ H01L 23/48; H01L 23/52; H01L 29/40
[52] U.S. Cl. ........................ 257/782; 257/783; 257/669; 257/674; 257/676; 257/643; 257/785
[58] Field of Search ..................... 257/783, 669, 257/674, 676, 643, 785

[56] References Cited

U.S. PATENT DOCUMENTS

| | | | |
|---|---|---|---|
| 4,535,350 | 8/1985 | Goodrich et al. ........................ | 357/74 |
| 5,237,205 | 8/1993 | Newman ................................... | 257/783 |
| 5,304,842 | 4/1994 | Farnworth et al. ...................... | 257/668 |
| 5,319,241 | 6/1994 | Lim ......................................... | 257/676 |
| 5,455,452 | 10/1995 | Kiyono ................................... | 257/668 |
| 5,514,905 | 5/1996 | Sakuta et al. ........................... | 257/666 |
| 5,552,637 | 9/1996 | Yamagata ................................ | 257/717 |
| 5,637,913 | 6/1997 | Kajihara et al. ........................ | 257/666 |

OTHER PUBLICATIONS

Elephane R–722 (For Taping Lead Frames), Tomoegawa.

*Primary Examiner*—Mahshid Saadat
*Assistant Examiner*—Jhihan B Clark

[57] ABSTRACT

A semiconductor device assembly having a support such as a lead frame paddle comprises a coating thereon to reduce or eliminate the flow of die attach adhesive from under the die and over bond sites or encapsulation regions. Thus undesirable effects resulting from this flow of adhesive, such as wire bonding problems and encapsulation problems, are reduced. A method for forming the assembly is also described.

17 Claims, 3 Drawing Sheets

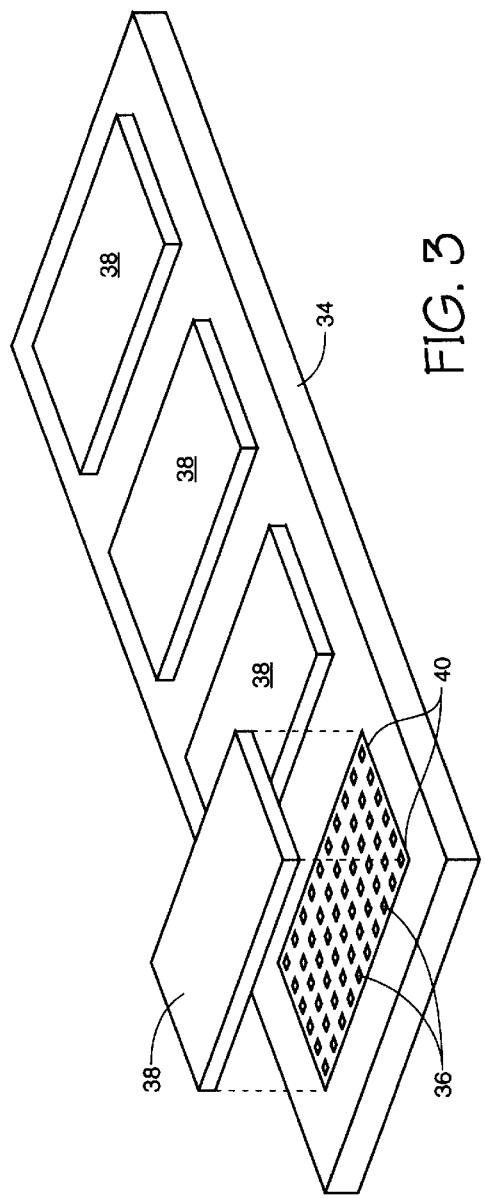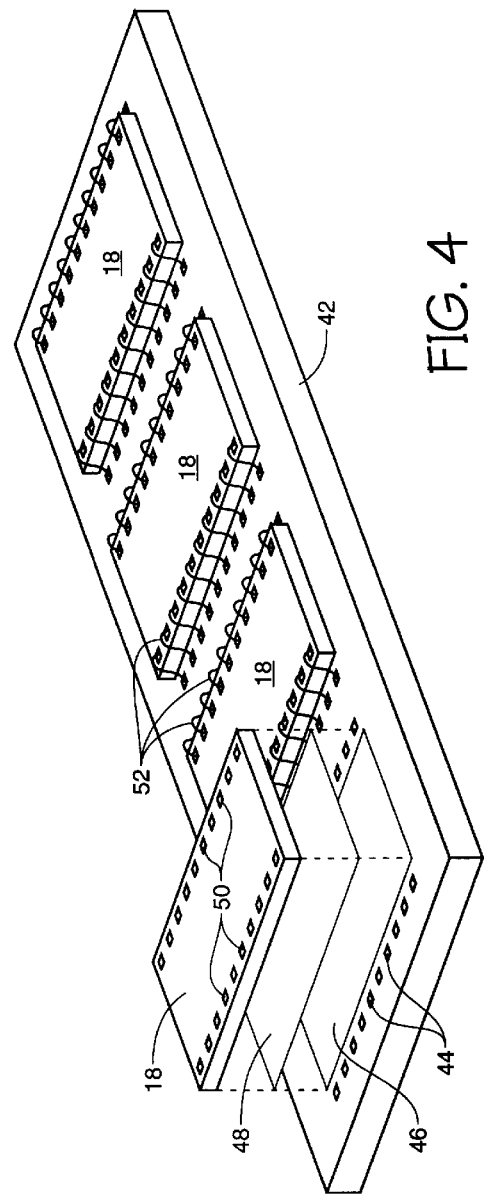

METHOD AND APPARATUS FOR REDUCING RESIN BLEED DURING THE FORMATION OF A SEMICONDUCTOR DEVICE

FIELD OF THE INVENTION

The sentence which begins the paragraph at page 2 line 22 should therefore read "Coating the support with a material such as one of those described above causes the adhesive to bead up on the paddle."

This invention relates to the field of semiconductor assembly, and more particularly to a method and apparatus used to reduce resin bleed associated with semiconductor assemblies comprising a lead frame or other support.

BACKGROUND OF THE INVENTION

During the manufacture of a semiconductor device several steps are commonly used with many types of devices such as microprocessors, memory devices, and logic devices. To adhere a semiconductor die to a paddle of a lead frame or to another support, an adhesive such as an organic resin or other flowable material is typically dispensed onto the paddle or other support and a semiconductor die is placed to contact the adhesive. A measured force is typically applied between the die and the lead frame to ensure adequate contact between the die and the adhesive, and a scrub may be used to facilitate adhesion between the die and the lead frame paddle. After curing the adhesive, terminals on the die are wire bonded to leads of the lead frame to electrically couple the die and the lead frame.

One problem encountered during semiconductor device assembly is referred to as "resin bleed." Resin bleed occurs when a portion of the adhesive which attaches the die to the lead frame flows from under the die to cover a portion of the paddle and may extend to cover a portion of the leads. This can result in poor or nonexistent electrical contact between the die and one or more leads to which the die is bonded, as the adhesive covers the bond site on the lead where the bond wire is attached. Resin bleed can also reduce adhesion between the lead frame and encapsulation material when the device is later encapsulated. Resin bleed is exacerbated when chemical components of the die attach adhesive separate with increasing temperatures thereby allowing the less viscous components of the material to flow more freely.

Various attempts have been made to reduce resin bleed, for example by increasing the cohesiveness and increasing the viscosity of die attach materials. Additional solutions for reducing resin bleed would be desirable.

SUMMARY OF THE INVENTION

The present invention provides a new apparatus that reduces problems associated with the manufacture of semiconductor devices, particularly problems resulting from the flow of die attach adhesive from under a die and over one or more portions of a lead frame or other support. Also disclosed is a method for forming the new apparatus. In accordance with one embodiment of the invention, a semiconductor support such as a paddle of a lead frame is coated with a material which reduces the surface tension of the paddle. Exemplary materials include epoxides, cyanates, urethanes, silicones, and acrylics. The coating is cured if necessary and a die attach adhesive is dispensed onto the lead frame paddle. A semiconductor die is attached to the lead frame using the adhesive, then device processing continues, for example by attaching a plurality of bond wires between the die and the lead frame and encapsulating the assembly.

Coating the support with a material such as one those described above causes the adhesive to bead up on the paddle. The inventive structure and method reduces or eliminates the flow of adhesive along the support thereby reducing or eliminating problems associated with the flow of adhesive from under the die. Objects and advantages will become apparent to those skilled in the art from the following detailed description read in conjunction with the appended claims and the drawings attached hereto.

BRIEF DESCRIPTION OF THE DRAWINGS

FIG. 3 is an exploded isometric view depicting a ball grid array application of the invention.

FIG. 4 is an exploded isometric view depicting a chip-on-board application of the invention.

It should be emphasized that the drawings herein may not be to exact scale and are schematic representations. The drawings are not intended to portray the specific parameters or the structural details of the invention, which can be determined by one of skill in the art by examination of the information herein.

DETAILED DESCRIPTION OF THE PREFERRED EMBODIMENT

Figure 1:
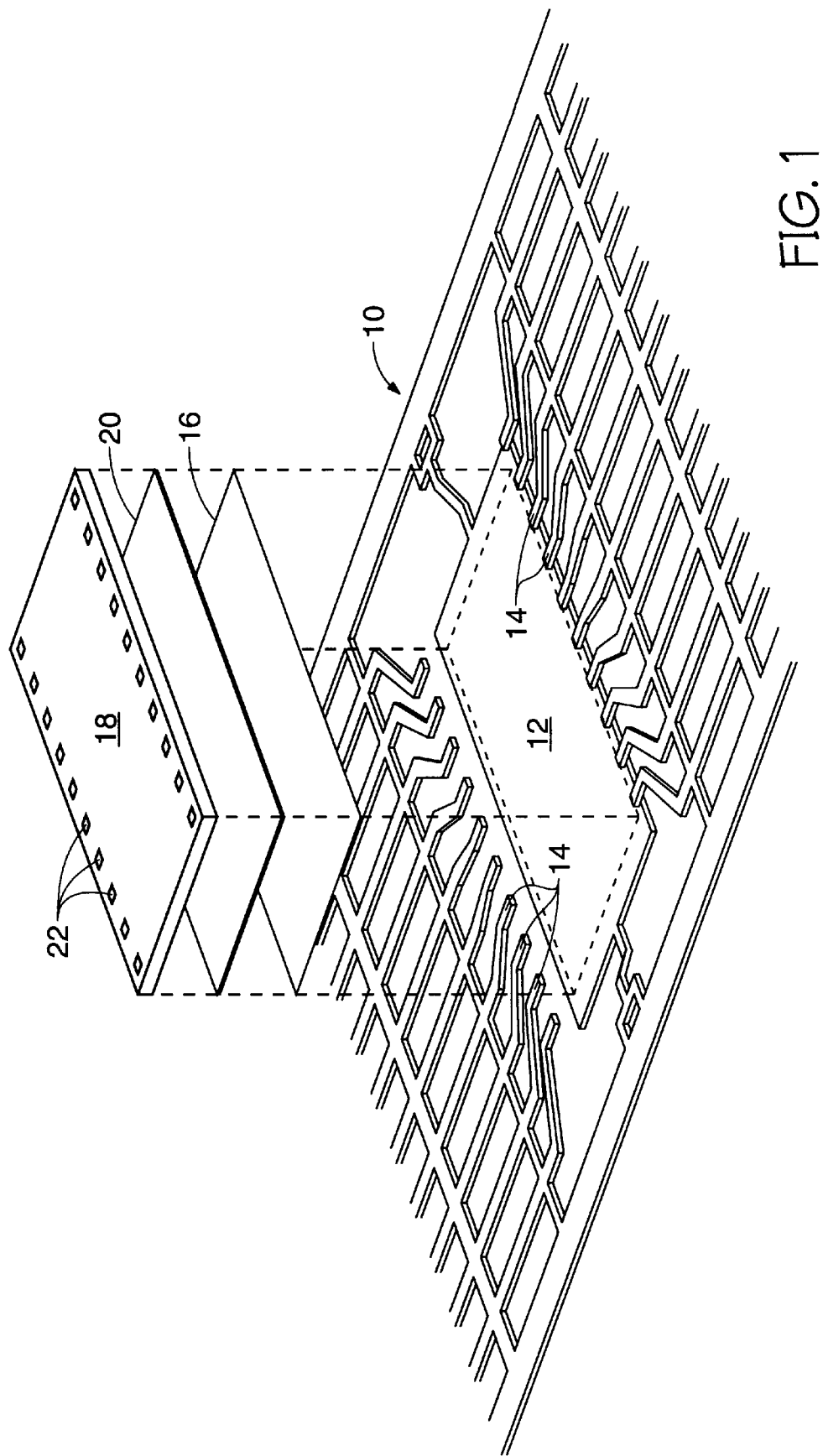
FIG. 1 is an exploded isometric view depicting a first embodiment of the invention.

FIG. 1 is an exploded isometric view of one embodiment of the inventive semiconductor device assembly comprising a conventional lead frame 10 having a paddle 12 and a plurality of leads 14, and further comprising an inventive coating 16 on the lead frame paddle 12. FIG. 1 further depicts a semiconductor die 18 such as a memory die, a microprocessor, a logic die, etc., which will be attached to the lead frame using an adhesive material 20 such as an organic resin such as Ablebond® 8360 available from Ablestik Electronic Materials and Adhesives of Rancho Dominguez, Calif. The die, in later processing steps, will be electrically coupled with the lead frame, for example using bond wires to attach bond pads 22 on the die with the leads, and will then be encapsulated or otherwise packaged according to means known in the art. The inventive coating 16 is described herein with reference to its application on a lead frame paddle, with a ball grid array application, and with a chip-on-board application, although supports having a surface tension higher than the inventive coating other than the lead frame paddle described may be used.

The coating on the paddle is formulated to reduce the surface energy (i.e. to decrease the surface tension) of the lead frame paddle. That is, this coating has a surface tension which is less than the surface tension of the paddle. Adhesive applied to the lead frame paddle having the inventive coating thereon beads up and resists flowing. A lead frame paddle without the inventive coating allows the adhesive to more readily flow from under the die to contact the leads which can result in the wire bond and encapsulation defects previously described.

The coating can comprise one or both of polyimide siloxane and polyimide resin as active ingredients, and can further comprise a solvent. Using these materials in a proportion of from about 20% to about 80% by weight polyimide siloxane or polyimide resin, or a combination of both, and from about 20% to about 80% by weight solvent would function sufficiently. A preferred coating comprises about 30% polyimide siloxane or about 30% polyimide resin, and about 70% solvent. The solvent itself can comprise a material such as N-methyl-2-pyrrolidone (NMP) or gamma-butyrolactone (BLO), or a combination of both, although other solvents may function adequately. Other active ingredients which may function sufficiently include epoxides, cyanates, urethanes, silicones, and acrylics which can be readily adapted by one of ordinary skill in the art from the description herein to provide a similar coating for the die support.

In this embodiment the coating in a nonsolid state is applied to the paddle so as to form a film over the paddle. To minimize the thickness of the completed package a very thin layer of the coating can be applied to the paddle. A preferred embodiment provides a coating about 25 micrometers or less in thickness, and can be a generally planar monolayer. In the alternative, a generally planar layer up to about 25 mils would be sufficient. The coating can be dispensed using any number of processes, including screen printing, spraying, syringe dispensing, painting, rolling, or dipping the coating on the paddle. Whatever method is used the coating should be applied uniformly on the paddle unless a particular assembly suggests otherwise.

Once the coating is applied to the paddle a cure step or a dry step may be required to set the coating. Using the polyimide coating described above, heating the coating to a temperature of about 200° C. for about 10 minutes would evaporate the solvents in the material. This drying step can be performed by placing the lead frame on a hot plate or other heating apparatus such as a SyncRite® SC-3002 In-line cure oven available from Toshoku, LTD. of Tokyo, Japan. A nitrogen atmosphere can be used to reduce oxidation or other problems during the cure step. Other cures may be required depending on the type of coating, for example by exposing the coating to infrared or ultraviolet radiation, or to an electron beam, or by moisture curing the coating. Generally, epoxides, cyanates, and acrylics can be cured with heat, urethanes can be cured with UV or E-beam, and silicones can be moisture cured, although the actual cure mechanism used depends on the application and the structure of the material.

Next, a die attach adhesive such as a flowable adhesive is applied to the coating. An example is the Ablebond® 8360 described earlier, although many other die attach adhesives are available which would function adequately with the invention. The adhesive can be applied to the paddle in a grid of dots or other patterns as known in the art. The die is placed in contact with the die attach adhesive, then the adhesive is cured. The coating on the paddle reduces the flux of the die attach adhesive from under the die as the coating on the paddle resists the flow of the material. Thus the spread of the adhesive across the paddle and leads is reduced.

Device assembly continues, for example including wire bonding the bond pads on the die with the leads of the lead frame and encapsulating the assembly according to conventional means.

Figure 2:
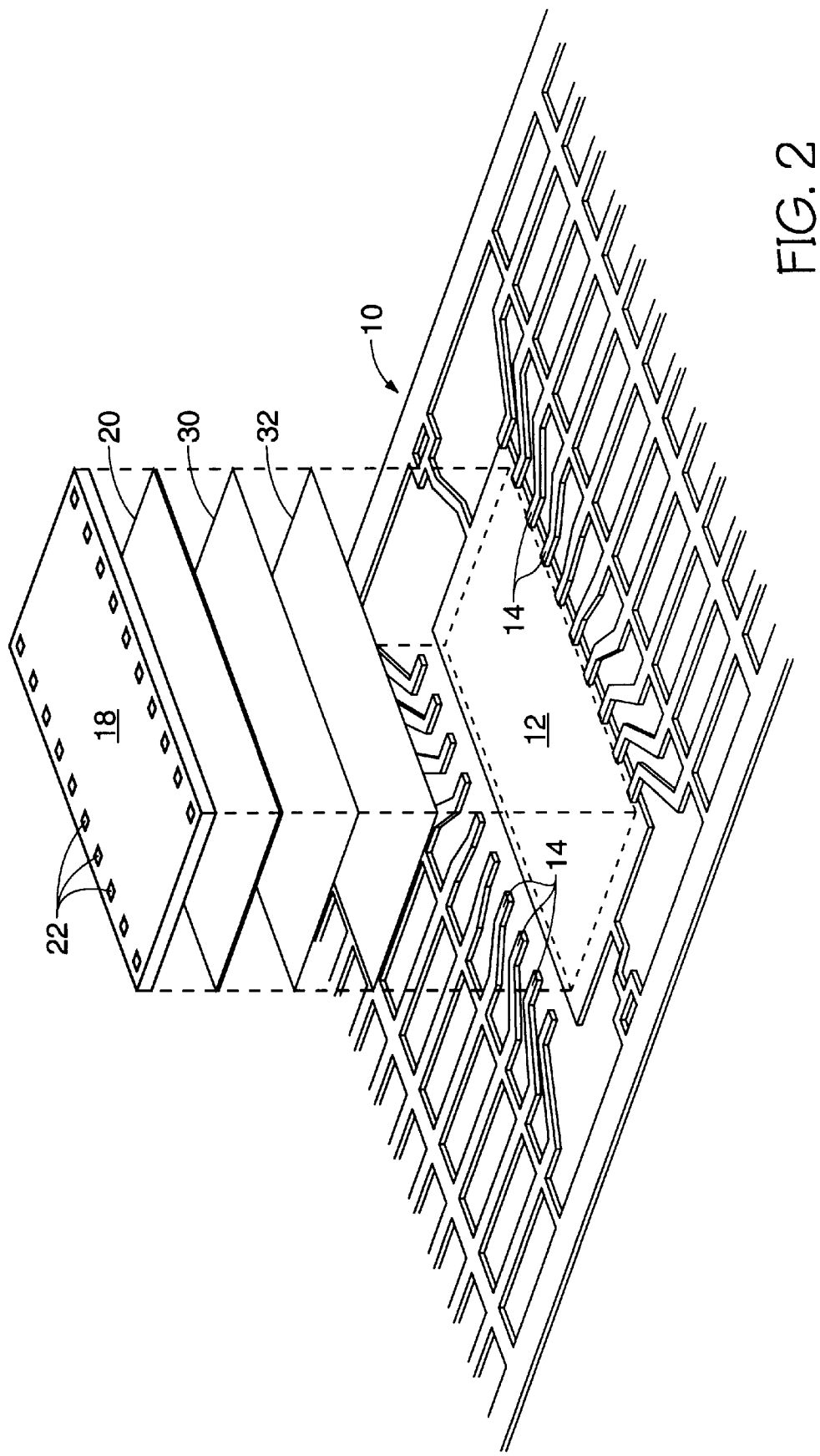
FIG. 2 is an exploded isometric view depicting a second embodiment of the invention.

FIG. 2 depicts a second embodiment of the invention. In this embodiment, a solid coating 30, for example one which is in solid form from curing, is applied to the paddle 12. Material 30 can comprise a 25 micrometer thick layer of Kapton® available from E.I. DuPont de Numours. Materials other than Kapton polyimide may function sufficiently. To bond the coating 30 with the paddle 12, an adhesive layer 32, for example comprising a pressure-sensitive adhesive such as acrylic resin is applied to the paddle 12 or to the coating 30. An acrylic film having a thickness of about 20 microns would function sufficiently. Layer 32 is contacted with the paddle and with the coating then layer 32 is cured. Generally, an adhesive layer other than a pressure-sensitive layer should be avoided to prevent the flow of a less viscous adhesive from under the die. Device processing then continues according to the embodiment of FIG. 1. The thickness, application method, and curing requirements of layer 32 is dependent on the material used and would be easily determined by one of ordinary skill in the art from the description herein.

FIG. 3 depicts a ball grid array assembly comprising an embodiment of the invention. With this embodiment a substrate assembly 34 such as a ceramic substrate has a plurality of pads 36 thereon for receiving a conductor (not shown) to electrically connect the pads 36 with terminals or bond pads (not shown) on a die 38. The circuit side of the die is placed facing the substrate assembly as is known in the art. The substrate assembly has thereon an inventive coating 40 as previously described. The coating is applied to the substrate assembly by any workable means such as by screen printing, spraying, painting, or rolling. The coating is applied and cured to leave the pads 36 uncovered by the coating so that electrical contact can be made between the pads 36 on the substrate 34 and terminals on the die 38. The coating around the pads reduces or eliminates the flow of the conductor, which can be a conductive epoxy, solder, or other conductive material, off the pads 36 which may cause shorting with an adjacent pad. A similar embodiment can be used with flip chip applications, for example using a printed circuit board instead of the ceramic substrate 34 described. A measured force is conventionally applied between the substrate and the die as the die is attached to the substrate to ensure a proper thickness of the conductor. If excessive force is applied between the die and the substrate, the conductor may thin out and flow from under the die.

FIG. 4 depicts an embodiment of the invention comprising a chip-on-board assembly. This embodiment comprises the use of a printed circuit board 42 having pads 44 thereon. The inventive coating 46 as previously described is applied to the printed circuit board 42 at one or more locations receiving a die using any workable means such as by screen printing, spraying, painting, or rolling. The coating 46 is then cured or dried if necessary. A die 18 is attached to the printed circuit board 42 using a die attach adhesive 48 interposed between the die and the coating, then terminals 50 on the die are wire bonded 52 or otherwise electrically connected to the pads 44 on the printed circuit board 42. The die attach adhesive 48 beads up on the coating more so than it would on the printed circuit board thereby reducing or eliminating the flow of the adhesive from under the die and onto the pads.

A semiconductor assembly comprising the invention can be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. An in-process semiconductor assembly comprising:
   a lead frame having a surface tension;
   an adhesive; and
   a coating consisting essentially of polyimide and at least one of N-methyl-2-pyrrolidone and gamma-butyrolactone contacting said lead frame, said coating having a surface tension less than said lead frame surface tension, wherein said coating is interposed between said adhesive and said lead frame.

2. The assembly of claim 1 wherein said coating comprises polyimide.

3. The assembly of claim 1 wherein said coating further contacts said adhesive.

4. The assembly of claim 1 wherein said coating is a monolayer.

5. An in-process electronic device comprising a semiconductor wafer section and a wafer section support, and further comprising:
   an adhesive layer interposed between said semiconductor wafer section and said wafer section support; and
   a coating layer comprising polyimide and at least one of N-methyl-2-pyrrolidone and gamma-butyrolactone interposed between said semiconductor wafer section and said wafer section support and contacting one of said wafer section and said wafer section support, wherein said coating layer is a material having the property of lowering the surface tension of a structure it coats.

6. The device of claim 5 wherein said coating layer coats and contacts said wafer section support, wherein said adhesive is interposed between said coating layer and said wafer section.

7. The device of claim 5 wherein said wafer section support is a lead frame.

8. The device of claim 5 wherein said wafer section support is a printed circuit board.

9. The device of claim 5 wherein said wafer section support is a ceramic substrate.

10. An in-process electronic device having a semiconductor assembly, the semiconductor assembly comprising:
    an adhesive layer;
    a wafer section support having a resistance to flowing of said adhesive layer;
    a semiconductor wafer section; and
    a coating layer consisting essentially of polyimide and at least one of N-methyl-2-pyrrolidone and gamma-butyrolactone interposed between said wafer section support and said wafer section wherein said coating layer contacts said wafer section support and further contacts said adhesive,
    wherein said coating layer has a resistance to flowing of said adhesive layer greater than said resistance of said wafer section support, and wherein said adhesive layer is interposed between said wafer section support and said wafer section.

11. The electronic device of claim 10 further comprising said coating layer interposed between said adhesive layer and said wafer section support.

12. The electronic device of claim 10 wherein said coating layer is a monolayer.

13. The electronic device of claim 10 wherein said wafer section comprises a circuit side which faces said support.

14. The electronic device of claim 12 wherein said coating layer comprises polyimide.

15. An in-process semiconductor assembly comprising:
    a lead frame having a surface tension;
    an adhesive; and
    a coating having a surface tension less than said lead frame surface tension, wherein said coating is interposed between said adhesive and said lead frame and said coating consists essentially of polyimide and at least one of N-methyl-2-pyrrolidone and gamma-butyrolactone.

16. An electronic device having a semiconductor assembly, the semiconductor assembly comprising:
    a semiconductor wafer section support;
    a coating layer overlying and contacting said wafer section support, wherein said coating layer consists essentially of polyimide and at least one of N-methyl-2-pyrrolidone and gamma-butyrolactone; and
    an adhesive layer contacting said coating.

17. The device of claim 16 further comprising a semiconductor wafer section,
    wherein said wafer section support and said coating layer each have a resistance to a flow of said adhesive layer and said resistance of said coating layer is greater than said resistance of said wafer section support.

* * * * *

UNITED STATES PATENT AND TRADEMARK OFFICE
CERTIFICATE OF CORRECTION

PATENT NO.   : 6,084,311
DATED        : July 4, 2000
INVENTOR(S)  : Jiang et al

Page 1 of 1

It is certified that error appears in the above-identified patent and that said Letters Patent is hereby corrected as shown below:

Column 1,
Lines 7-10, please delete (the first full paragraph after "FIELD OF THE INVENTION") in their entirety.

Column 2,
Line 1, after "such as one" please insert -- of --.

Signed and Sealed this

Fourth Day of December, 2001

Attest:

*Nicholas P. Godici*

NICHOLAS P. GODICI
*Attesting Officer*     *Acting Director of the United States Patent and Trademark Office*